US008692337B2

(12) United States Patent
Berthelot et al.

(10) Patent No.: US 8,692,337 B2
(45) Date of Patent: Apr. 8, 2014

(54) STRUCTURE WITH A MOVING PORTION AND A BURIED ELECTRODE FOR MOVEMENT DETECTION INCLUDED IN A MULTI-SUBSTRATE CONFIGURATION

(75) Inventors: Audrey Berthelot, St Ismier (FR); Vincent Larrey, La Murette (FR); Jean-Philippe Polizzi, Grenoble (FR); Marie-Hélène Vaudaine, Seyssins (FR); Hemant Desai, Gilbert, AZ (US); Woo Tae Park, Seoul (KR)

(73) Assignees: Commissariat a l'energie atomique et aux energies alternatives, Paris (FR); FREESCALE Semiconductor Inc, Austin, TX (US)

( * ) Notice: Subject to any disclaimer, the term of this patent is extended or adjusted under 35 U.S.C. 154(b) by 0 days.

(21) Appl. No.: 13/546,751

(22) Filed: Jul. 11, 2012

(65) Prior Publication Data

US 2013/0175643 A1   Jul. 11, 2013

(30) Foreign Application Priority Data

Jul. 12, 2011   (FR) ...................................... 11 56351

(51) Int. Cl.
*H01L 29/84* (2006.01)
(52) U.S. Cl.
USPC .................................. 257/415; 257/E29.324
(58) Field of Classification Search
USPC .......................................... 257/415, E29.324
See application file for complete search history.

(56) References Cited

U.S. PATENT DOCUMENTS

| | | | |
|---|---|---|---|
| 6,661,069 B1 * | 12/2003 | Chinthakindi et al. ....... | 257/415 |
| 6,761,068 B1 | 7/2004 | Schmid | |
| 7,083,997 B2 | 8/2006 | Brosnihhan et al. | |
| 7,180,019 B1 * | 2/2007 | Chiou et al. ........... | 200/61.45 R |

(Continued)

FOREIGN PATENT DOCUMENTS

| FR | 2 932 789 A1 | 12/2009 |
|---|---|---|
| WO | WO 2007/135878 A1 | 11/2007 |
| WO | WO 2010/081603 A1 | 7/2010 |

OTHER PUBLICATIONS

U.S. Appl. No. 13/546,411, filed Jul. 11, 2012, Giroud, et al.

(Continued)

*Primary Examiner* — Ida M Soward
(74) *Attorney, Agent, or Firm* — Oblon, Spivak, McClelland, Maier & Neustadt, L.L.P.

(57) ABSTRACT

A device being a micro-system and/or a nano-system which includes a first substrate, having at least one lower electrode and at least one dielectric layer, and includes an intermediate substrate extending across a main plane of the device and including a moving portion. The intermediate substrate is attached, outside the moving portion, by molecular bonding to the first substrate. The moving portion faces at least a portion of the lower electrode. The device also includes an upper substrate, attached to the intermediate substrate. The moving portion is movable between the lower electrode and the upper substrate. The first, intermediate, and upper substrates extend in a plane parallel to the main plane of the device. The lower electrode detects a component of the movement of the moving portion perpendicular to the plane of the device.

13 Claims, 8 Drawing Sheets

(56) References Cited

U.S. PATENT DOCUMENTS

| | | | |
|---|---|---|---|
| 7,192,001 B2* | 3/2007 | Wise et al. ............... | 251/11 |
| 7,528,691 B2* | 5/2009 | Wallis et al. ............... | 335/78 |
| 7,859,091 B2* | 12/2010 | Fujii et al. ............... | 257/684 |
| 7,893,798 B2* | 2/2011 | Foster et al. ............... | 335/78 |
| 7,950,288 B2 | 5/2011 | Fujii et al. | |
| 8,193,550 B2* | 6/2012 | Sassolini et al. ............... | 257/98 |
| 8,267,583 B2* | 9/2012 | Yao et al. ............... | 384/31 |
| 8,269,290 B2* | 9/2012 | Sugiura ............... | 257/415 |
| 8,318,526 B2* | 11/2012 | Tan et al. ............... | 438/69 |
| 2003/0001221 A1 | 1/2003 | Fischer et al. | |
| 2003/0093895 A1* | 5/2003 | Miyazaki et al. ............... | 29/622 |
| 2006/0208326 A1 | 9/2006 | Nasiri et al. | |
| 2007/0090474 A1 | 4/2007 | Li et al. | |
| 2007/0113661 A1 | 5/2007 | Benzel et al. | |
| 2008/0176046 A1 | 7/2008 | Yamaguchi et al. | |
| 2009/0297770 A1* | 12/2009 | Yoshida et al. ............... | 428/138 |
| 2009/0321887 A1 | 12/2009 | Larrey et al. | |
| 2010/0019388 A1 | 1/2010 | Dennison et al. | |
| 2010/0193884 A1* | 8/2010 | Park et al. ............... | 257/414 |
| 2011/0012247 A1* | 1/2011 | Wu ............... | 257/678 |
| 2011/0156106 A1* | 6/2011 | Lee et al. ............... | 257/254 |
| 2012/0001277 A1 | 1/2012 | Park et al. | |
| 2012/0248615 A1* | 10/2012 | Chien et al. ............... | 257/770 |
| 2012/0313235 A1* | 12/2012 | Chu et al. ............... | 257/692 |
| 2013/0076202 A1* | 3/2013 | Naito et al. ............... | 310/300 |

OTHER PUBLICATIONS

French Preliminary Search Report issued Jan. 24, 2012, in Patent Application No. 1156351 (with English Translation of Category of Cited Documents).

Anu Kärkkäinen, et al., "Optimized Design and Process for Making a DC Voltage Reference Based on MEMS", IEEE Transactions on Instrumentation and Measurement, vol. 54, No. 2, XP 011128181, Apr. 2005, pp. 563-566.

T. Yamamoto, et al., "Capacitive Accelerometer with High Aspect Ratio single crystalline Silicon Microstructure Using the SOI Structure with Polysilicon-Based Interconnect technique", Proceedings of the IEEE 13$^{th}$ Annual International Conference on Micro Electro Mechanical Systems MEMS, XP 001045369, Jan. 23, 2000, pp. 514-519.

Andreas Plöβl, et al., "Wafer direct bonding: tailoring adhesion between brittle materials", Materials Science and Engineering, vol. R25, No. 1-2, XP 004167445, Mar. 10, 1999, pp. 1-88.

Yogesh B. Gianchandani, et al., "Impact of Long, High Temperature Anneals on Residual Stress in Polysilicon", Transducers, IEEE International Conference on Solid-State Sensors and Actuators, Jun. 16-19, 1997, pp. 623-624.

Q. -Y. Tong, "Principles of wafer bonding", INSPEC, Chapter 1, 2002, pp. 1-20.

* cited by examiner

STRUCTURE WITH A MOVING PORTION AND A BURIED ELECTRODE FOR MOVEMENT DETECTION INCLUDED IN A MULTI-SUBSTRATE CONFIGURATION

TECHNICAL FIELD AND PRIOR ART

The invention concerns the field of micro- and nano-systems and their manufacture.

In this type of device, moving mechanical structures are produced by selectively etching the layers of material, or sacrificial layers, which are underneath the moving structure.

The invention notably enables gyroscopes to be produced, with detection elements with parallel capacitive electrodes, above and below the moving structured layer.

The present invention applies more specifically to the field of micro-systems, with detection elements with capacitive electrodes parallel to the plane of the moving portion produced in a structured thin layer (for example, micro-gyroscopes).

As an example of such a system, the MEMS described in document US2006/0208326 may be cited. In this document an AlGe hermetic metal seal is produced between two substrates. A moving MEMS structure is located in the first substrate. The second substrate (Cap) may be a CMOS with an aluminium upper electrode.

Such microstructures can be manufactured by various known methods.

In particular, they can be produced from a Si substrate of the "bulk" type, on which a sacrificial layer (for example SiO2) is deposited, or made to grow, followed by the structural layer (for example polycrystalline silicon). The bulk silicon substrate can then be structured before deposition of the sacrificial and structural layers, in order to obtain, for example, electrodes or connections.

However, in this case the structural layer cannot be monocrystalline silicon, since it is not possible to deposit monocrystalline silicon, or make it grow, on an insulating layer, or a layer of any nature other than monocrystalline silicon. In addition, this non-monocrystalline structural layer has degraded mechanical properties compared to monocrystalline silicon. Lastly, thick structural layers cannot be deposited due to the very lengthy treatment times, and the costly nature which results therefrom.

In addition, the problem of the stress generated by thick layers is posed, as explained in the document Ganchandani et al. Impact of long, high temperature anneals on residual stress in polysilicon, 1997 International Conference on Solid-State Sensor and Actuators.

As a variant, it is possible to manufacture a micro-system from 2 silicon substrates, one of which is covered with an oxide layer. The two substrates are attached by direct bonding.

As an example of such a system, the one described in the article of Yamamoto et al may be cited. Title: "Capacitive Accelerometer with high aspect ratio single microstructure Using the SOI structure with polysilicon-based Interconnect technique", which describes the manufacture of MEMS from a direct bonding of 2 substrates. On a first substrate, after deposition of an oxide layer, a layer of polycrystalline silicon is deposited, and then structured to form a lower electrode. After deposition and polishing of a new oxide layer the substrate is bonded by direct bonding to another silicon substrate, and then thinned by the structured face. The MEMS is then structured in the substrate which has been thinned by DRIE, and then released by etching of the sacrificial layer.

This manufacturing method has 2 disadvantages.

Firstly, after direct bonding and thinning, the first levels and the alignment marks are buried and therefore invisible. And it is necessary to be able to align the following levels (notably the MEMS level) with the first buried levels (notably the lower electrode). The article of Yamamoto et al mentioned above proposes to generate deep alignment marks at the start of the manufacturing method, and to fill them with oxide, and finally to reveal them again after thinning. Another method is to generate alignment marks on the rear face of the second substrate, and to seal the 2 substrates with alignment. After thinning the marks on the rear face of the second substrate would be used for alignment of the following levels.

Furthermore, with this manufacturing method, it is not possible to create a contact of the lower electrode to the substrate.

Lastly, the technique described in document US2010/0193884 implements the formation of a MEMS with a lower electrode and an upper electrode, using 2 metal seals.

The disadvantage of this method is that the thermal budget must be restricted after the first metal seal and the formation of the lower electrode.

Moreover, in this technique the 2 substrates are structured separately. They are then sealed (by metal sealing) with an alignment of the 2 substrates, which requires particular and expensive equipment.

The problem of finding a new production method, and a new structure of the micro- and/or nano-system type, which does not have the disadvantages explained above, is therefore posed.

Account of the Invention

A device of the micro- and/or nano-system type, for example MEMS and/or NEMS, is first described, including:
- a first substrate, having at least one lower electrode, and a dielectric layer, positioned between the lower electrode and the first substrate; this first substrate, or lower substrate, can be, for example, made of a monocrystalline or polycrystalline semiconducting material, or it has an SOI substrate, or has several stacked materials;
- an intermediate substrate having a moving portion, attached, outside the moving portion, by molecular bonding, or direct bonding, with the first substrate, where the moving portion is facing at least a portion of the lower electrode,
- an upper substrate, attached to the intermediate substrate, for example of the CMOS type, where the said moving portion can be made to move between the lower electrode and the upper substrate.

The electrode or electrodes enable the component, perpendicular to the main plane of the device, of the movement of the moving portion to be initiated or detected; but this movement of the moving portion can, in addition, have other components, particularly in a plane parallel to this main plane.

This structure enables a stress on the thermal budget after formation of the lower electrode to be avoided. Indeed, it enables a connection between the intermediate substrate and the first substrate, or a portion of the dielectric layer formed on the latter, to be generated, which enables no temperature limit to be imposed for the steps following the formation of the lower electrode.

The upper electrode can include at least one electrode, where the moving portion is facing at least a portion of this upper electrode, and where it is able to be made to move between the lower electrode and the upper electrode.

The upper substrate may be fixed securely to the intermediate substrate by means of a sealing bead.

Means can be provided to form an electrical contact between the lower electrode and the upper electrode, and/or means can be provided to form an electrical contact between the lower electrode and the first substrate.

The intermediate substrate is preferably made from monocrystalline silicon.

A method is also described to produce a device of the MEMS and/or NEMS type including the following steps:
  forming a first substrate, including at least one electrode, called the lower electrode, and a first dielectric layer,
  then followed by assembling, by molecular bonding, an intermediate substrate, with the first substrate,
  the assembling step being then followed by producing a moving portion in the intermediate substrate,
  this step of producing a moving portion being then followed by forming a cavity in the first dielectric layer, at least under the moving portion, such that the moving portion is facing at least a portion of the lower electrode,
  the cavity forming step being then followed by assembly of a substrate, called the upper substrate, with the intermediate substrate, such that the said moving portion can be made to move between the lower electrode and the upper substrate, at least in a direction perpendicular to this lower electrode and, possibly, in a plane parallel to the main plane or to this lower electrode. The electrode or electrodes therefore enable the component, perpendicular to the main plane of the device, of the movement of the moving portion to be initiated or detected, with the understanding that this movement of the moving portion can have other components, particularly in a plane parallel to this main plane.

The upper substrate can include at least one electrode, called the upper electrode, where the assembly is such that the moving portion is facing at least a portion of the upper electrode, and where the said moving portion can be made to move between the lower electrode and the upper electrode.

Alignment marks can be made in the rear face of the lower substrate. It is then possible to fix this structured lower substrate securely to the intermediate, unstructured substrate. This sealing can be accomplished without special equipment. When the intermediate substrate has been thinned, if applicable, the different levels are aligned with the marks generated in the rear face of the lower substrate. In particular, these marks are also used for the alignment of the upper substrate when it is assembled with the remainder of the structure.

In a method or device as presented above, or as explained below:
  The upper substrate may be fixed securely to the intermediate substrate by means of a sealing bead;
  and/or means can be provided to form an electrical contact between the lower electrode and the upper electrode and/or means can be provided to form an electrical contact between the lower electrode and the first substrate;
  and/or the intermediate substrate is made from monocrystalline silicon;
  and/or the upper substrate is fixed securely to the intermediate substrate hermetically and/or using a sealing bead and/or by eutectic sealing or by thermocompression using the sealing bead.

BRIEF DESCRIPTION OF THE ILLUSTRATIONS

DETAILED ACCOUNT OF PARTICULAR EMBODIMENTS

In the remainder of this document reference is made to molecular bonding, also called direct bonding or direct sealing. This assembly technique is described notably by Q. Y. Tong in "Silicon Wafer Bonding Technology for VLSI and MEMS applications", Edited by S. S. Iyer and A. J. Auberton-Herve, 2002, INSPEC, London, Chapter 1, pages 1-20.

Figure 1:
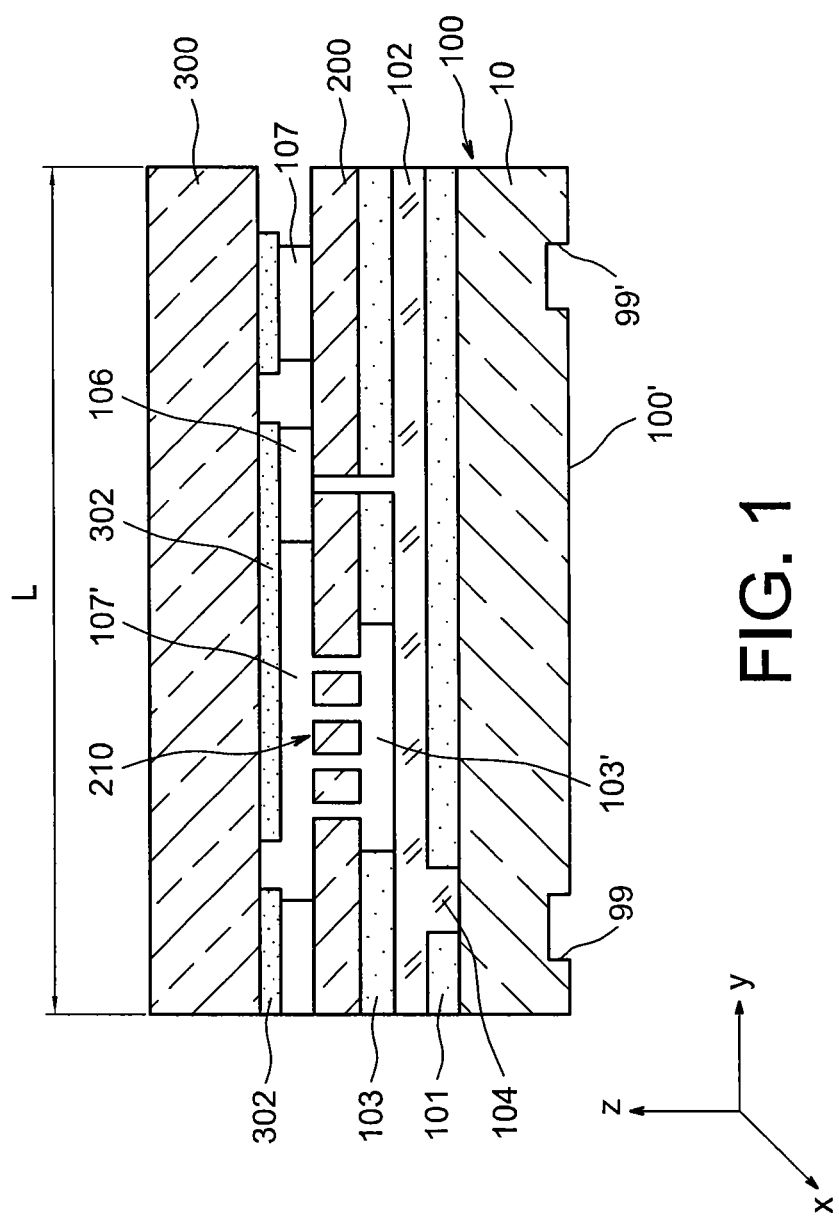
FIG. 1 represents a gyroscope with 2 detection elements with parallel capacitive electrodes, beneath and above the oscillating mass.

An example of a structure illustrated in FIG. 1, which is a section view, is first described.

In the remainder of the document, when mention is made of a "substrate" 100, 200, 300, the term "layer" may also be understood. Consequently, for these three elements, one or other of these terms is used without differentiation.

The structure of FIG. 1 can be produced in 3 superimposed substrates 100, 200, 300 attached to one another, where substrate 200 is positioned between substrate 100 and substrate 300.

Substrate 200 is, for example, between several tens of μm and several hundreds of μm thick, for example between 10 μm and 100 μm or 500 μm thick.

Each of these substrates extends principally in a plane xy, where axis z is perpendicular to each of them. For this reason, plane xy is also called the main plane of the device. The thickness of each substrate, measured along axis z, can be very small compared to the lateral extensions of the device, i.e. compared to dimensions p and l of the device measured in the xy plane; p (measured along axis x) is, for example, between 10 μm and 10000 μm and l (measured along axis y) is, for example, between 10 μm and 10000 μm.

Figure 4:
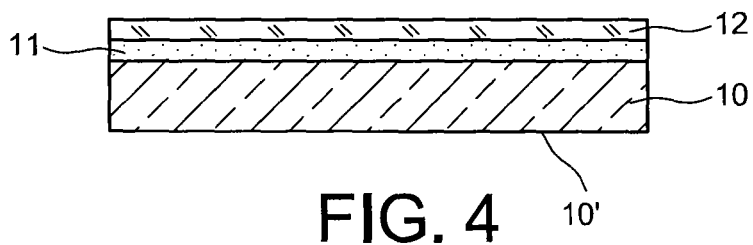
FIG. 4 represents an SOI substrate structure.

Substrate 100 can include a portion 10 made of a semiconducting material, whether monocrystalline or polycrystalline, for example made of silicon, or SiGe or SiC or SiGeC or GaAs or InAs or InP or Ge. As a variant, this substrate 100 may be a substrate of the "silicon on insulator" (SOI) type, including, as can be seen in FIG. 4, a substrate 10 made of a semiconducting material, a buried oxide layer 11 and a thin layer 12 of silicon. In this case, dielectric layer 101 and lower electrode 102 are formed respectively by buried oxide layer 11 and thin silicon layer 12, which may possibly be doped. The advantage of this embodiment is notably the possibility, when the complete device has been produced, of being able to thin this substrate by the rear face, stopping at dielectric layer 11 and forming, by rear face 10', the interconnections of the means forming an electrical contact in dielectric layer 12.

As another variant, substrate 100 may include several stacked layers, which each layer may, for example, be one or other of the materials mentioned above. The advantage of stacking several layers notably lies in the possibility of stacking several sensors, or a sensor and its associated electronics, in order to save space in the final component.

Substrate 200 can be a semiconducting material, whether monocrystalline or polycrystalline, for example made of silicon, or SiGe or SiC or SiGeC or GaAs or InAs or InP or Ge.

Substrate 300 (Cap) may be a CMOS substrate including, for example, another sensor, or a substrate 30 with only one upper electrode, or again a protective mechanical cap.

In the remainder of the document, the lower portion or side of the device refers to the portion turned towards substrate 100, and the upper portion or side of the device refers to the portion turned to the opposite side, towards substrate 300.

A hermetic sealing bead 107 is produced between the 2 substrates 100, 300; it is, for example, a eutectic seal or a seal by thermocompression, using materials such as AlGe, AuSn, AuGe or AuSi. This bead 107 is of a thickness such that a space 107' is defined between the upper face of substrate 200 and upper electrode 302. This space 107' allows a certain mobility of mobile mass 210, in direction z, roughly perpendicular to the plane of the device. An example of a moving mass will be seen below, in connection with FIG. 5, which can also move in the plane of the device, i.e. in plane xy.

Substrates 100, 200 are preferably connected by molecular bonding (for a good hermitic sealing) at the interface formed by oxide layer 103. For this reason, each of these substrates are preferably in a semi-conductor material. Layer 103 is a sacrificial layer: a portion of this layer 103 is eliminated, so as to form a cavity 103' enabling moving mass 210 to be allowed freedom of movement in direction z, roughly perpendicular to the plane of the device. Moving mass 210 is positioned between cavity 103' and cavity 107'.

An oxide layer 101, which acts as a support for an electrode 102, is formed on first substrate 100. This oxide layer 101 is therefore positioned between substrate 100 and electrodes layer 102. It may or may not be structured. In the case of an SOI substrate (FIG. 4), these layers are formed, respectively, by oxide layer 11 and layer 12 of semiconducting material, where the latter may be doped.

Substrate 200 is structured so as to define moving mass 210.

Figure 5:
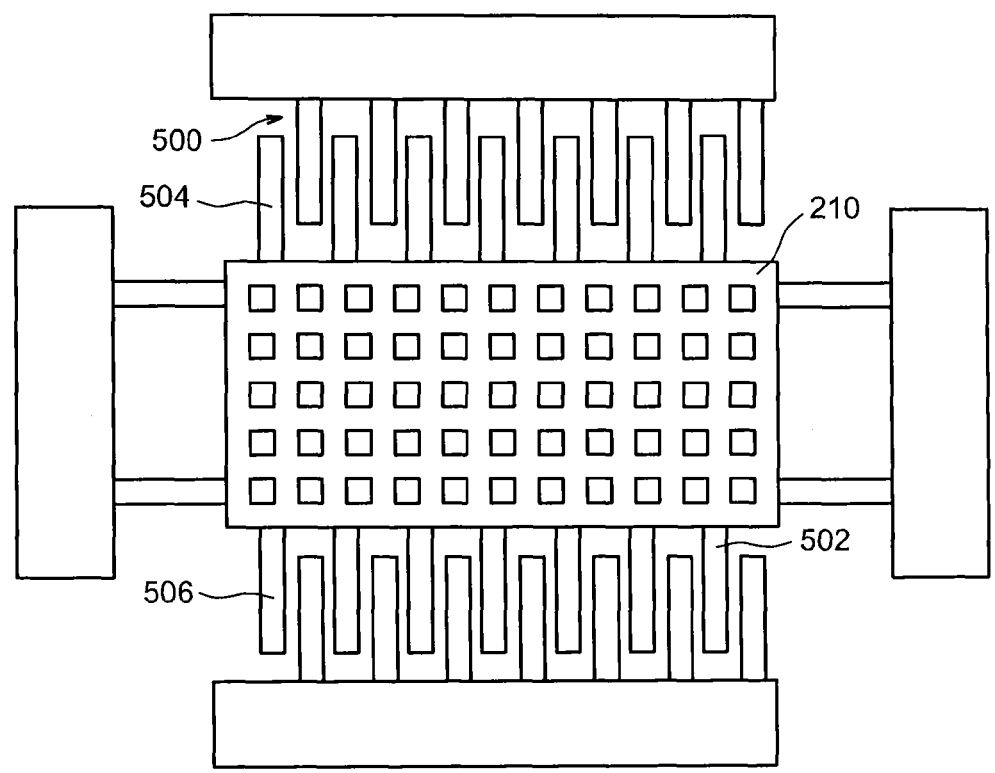
FIG. 5 represents a simplified top view of the intermediate substrate, with a moving structure.

FIG. 5 represents a simplified top view of substrate 200, with an example of a moving mass structure 210, also including means for detecting the movement of the moving mass in the plane of layer 200.

The structure of this FIG. 5 represents a moving mass 210 fitted laterally with interdigitated electrostatic combs, some of which, 500, 506, are fixed, and others of which, 504, 506, are moving, where a moving comb, 504, 506, is interdigitated with a fixed comb, 500, 502. A variation of distance between a fixed comb and the moving comb opposite it results from the movement of the latter, which in turn results from a movement of moving mass 210, leading to a variation of capacity detected by means provided for this purpose.

Furthermore, moving mass 210 is free to move, for example essentially along axis Z. But the movement of the moving portion may also have a component in a direction roughly parallel to this axis Z, or again in the plane parallel to the main plane of the device.

It is this displacement which can be detected by lower electrodes 102 and upper electrodes 302.

Electrode 302, called the upper electrode, is positioned on the surface of substrate 300 turned towards moving mass 210. The latter is thus facing each of electrodes 102, 302 and a movement of the mass of 110 outside the plane of the device will be detected using these two capacitive detection electrodes. These two electrodes are positioned parallel to substrate 200 which contains moving mass 210.

Upper electrode 302 and lower electrode 102 in particular allow the movement of moving mass 210 outside the plane of the layers to be detected.

This detection is preferentially of the capacitive type. However, in another embodiment, illustrated in FIG. 2K, the device may have only one electrode facing the moving portion, where the detection of the movement of the moving portion is obtained, in this case also, by a capacitive variation between the moving portion and the electrode. As a variant, this same device of FIG. 2K may be fitted with a cap 300, without an upper electrode. Contacts 104, 106 can be included, respectively between lower electrode 102 and substrate 100, and/or between these electrodes and the surface of substrate 200. In particular, contacts 106 enable an electrical connection to be established between lower electrodes 102 and upper electrodes 302.

References 99, 99' designate possible alignment marks, formed in rear face 100' of substrate 100, which is the face which does not support layers 101, 102, 103.

This structure is found in the other example embodiments presented below.

These aspects of the invention can apply for all the devices described in the remainder of the document.

FIGS. 2A-2K illustrate a first example of a method to produce a device as described above.

In this example method it is explained how a structural layer 200 of an MEMS made of thick monocrystalline silicon is formed, together with a lower capacitive electrode 102, for detection outside the active zone of the MEMS, with a contact 104 of this lower electrode 102 in the substrate.

One commences (FIG. 2A) with a substrate 100 which may consist of one of the materials previously mentioned above. If applicable, alignment marks 99, 99' may be made in rear face 100' of this substrate, where this rear face is defined as the face opposite the one on which the various deposition operations are to be accomplished. The role of these alignment marks will be explained below. These alignment marks can also be made at a later stage.

On this substrate 100 an insulating layer 101 (FIG. 2B), for example made of silicon dioxide SiO2, or of another material with a low dielectric constant (for example, lower than 5), is deposited or made to grow. This insulating layer enables future lower electrode 102 of substrate 100 to be insulated.

Figure 2A:
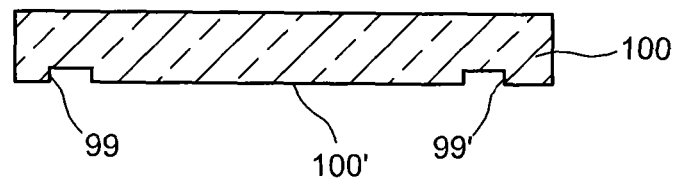
FIGS. 2A-2K represent various steps in the production of such a device.
Figure 2B:
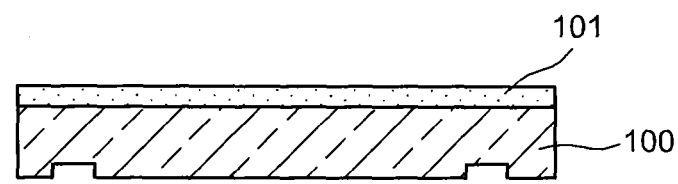
Figure 2C:
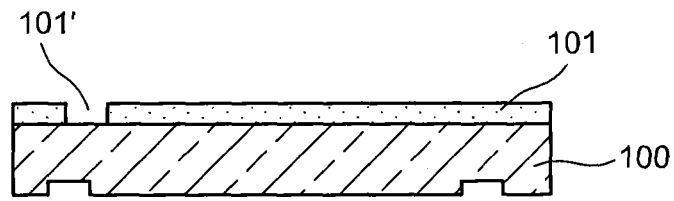

As can be seen in FIG. 2C, this insulating layer can be structured (for example by chemical or plasma etching), in order subsequently to, for example, bring lower electrode 102 and substrate 100 into contact. One or more openings 101' are then formed in layer 101, one or more of which may emerge in the surface of substrate 100 on which layer 101 has been deposited.

Figure 2D:
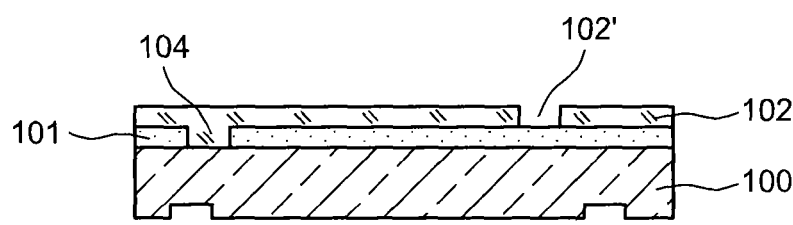

A lower electrode layer 102, made for example of polycrystalline silicon, or of doped amorphous silicon, or of polycrystalline or amorphous germanium, or more generally, in a semi-conductor material, possibly doped, or more generally of a conducting material, is then deposited on layer 101 (FIG. 2D). Another particular example is N or P doped polysilicon. Selecting a semi-conductor material for this layer 102 makes it possible to implement molecular bonding. This layer 102 is, for example, between 100 nm and 5 μm or 10 μm thick. A deposition technique can be chosen from one of the following techniques: LPCVD, PECVD, MBD, or others. If layer 101 has previously been structured the material constituting this electrode layer reaches, through openings 101', the surface of substrate 100, thus forming a contact 104 with the latter. This contact 104 enables certain elements of the device to be earthed; rear face 100' of substrate 100 may also be earthed.

Layer 102 may possibly, as illustrated in FIG. 2D, be structured, by formation of a cavity 102', for example by etching, where this etching is stopped at insulating layer 101. This structuring of the lower electrode enables certain portions to be insulated from one another. If one has commenced with an SOI substrate (FIG. 4), cavities 101' will have been obtained by etching of dielectric layer 11 from rear face 10'. The next step is the deposition of an insulating layer 103, the thickness of which will enable the distance separating electrode 102 from substrate 200 to be defined (and therefore the distance separating this electrode from future moving portion 210), when the latter has been attached to first substrate 100. This layer is, for example, made of an oxide such as silicon oxide (again, for example: TEOS oxide). It can also be of the order of several hundred nanometers thick, for example between 50 nm and 500 nm or 1 μm.

Figure 2E:
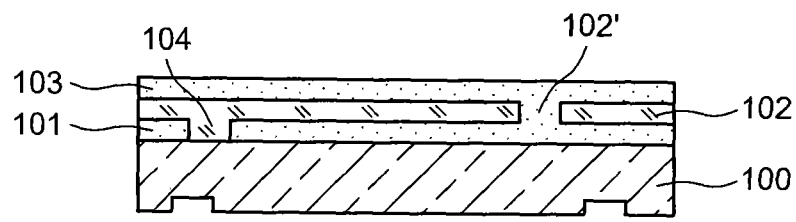
Figure 2F:
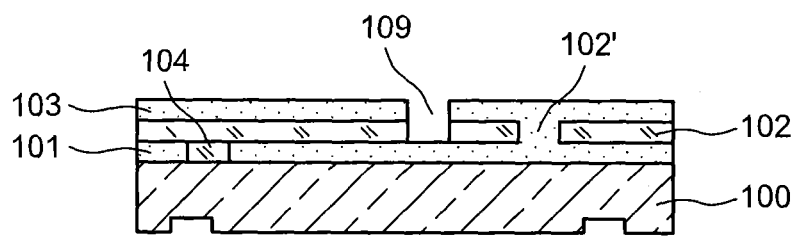
Figure 2G:
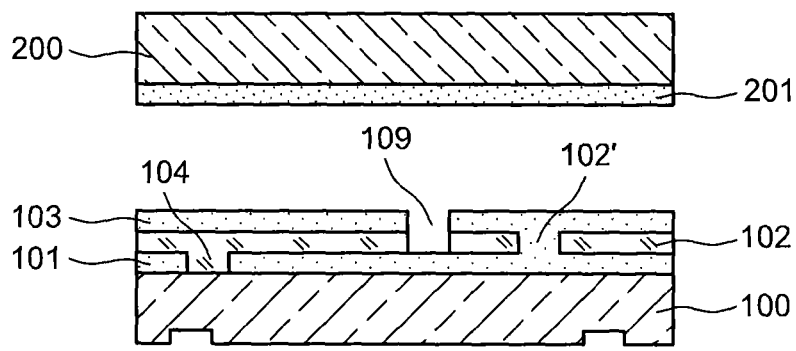

This insulating layer 103 can be deposited only on lower electrode 102, as illustrated in FIG. 2E or only on substrate 200, or partly on lower electrode 102 and partly on substrate 200 (as can be seen in FIG. 2G, with layers 103 and 201). Whichever possibility is chosen, this insulating layer will form a sacrificial layer which will be etched to release oscillating mass 210, as explained below.

If layer 102 has been previously structured, the material of insulating layer 103 also fills portions 102' structured or etched in layer 102, and comes into contact with the upper surface of insulating layer 101. Certain portions of lower electrode 102 may be insulated by this insulating layer 103.

A cavity 109 may possibly, as illustrated in FIG. 2F, be etched in insulating layer 103 and in electrode layer 102, the etching being stopped on insulating layer 101. It is therefore possible to structure layer 103 and possibly layer 102. Different portions of the lower electrode may be insulated from one another by these cavities 109 and/or by the presence, in this electrode layer, of zones of insulating material 103, as explained above.

It is also possible, with a view to molecular-type bonding, to accomplish:
- a densification of this layer 103, for example by oxidisation at a temperature close to the bonding temperature (for example 1050° C.), in order that all the layers have a thermal budget similar to that of the bonding (this stage notably allows the layers to be degassed). This step of densification enables the same density of layers 103 and 201 to be obtained, for improved bonding effectiveness, in order to have similar etching speeds in the final release (at a later stage both these sacrificial layers under the moving portion are etched),
- and/or polishing of layer 103, which enables a very flat surface to be obtained for the molecular sealing.

Figure 2H:
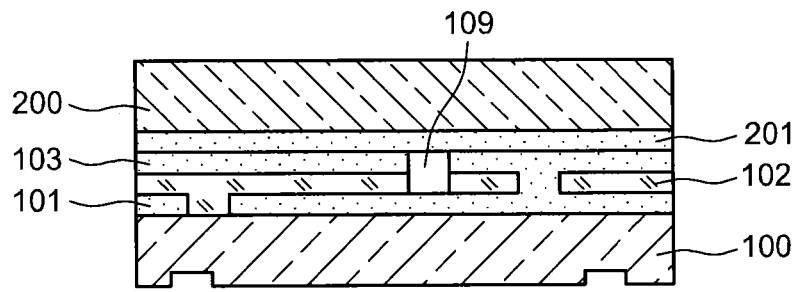
Figure 2I:
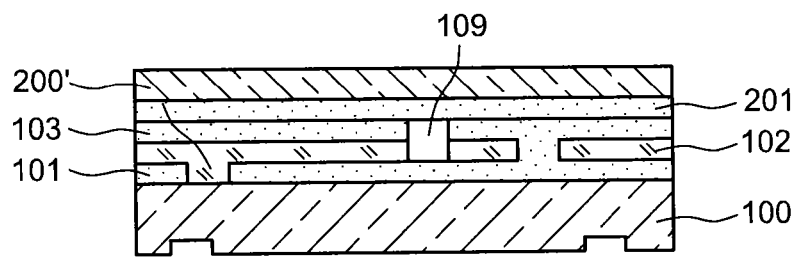

It is then possible to apply a direct bonding (or molecular bonding) of this substrate 100, prepared in this manner, with a second substrate 200, preferably made of thick monocrystalline silicon (FIG. 2G). It is then the surface of insulating layer 103 which comes into contact with substrate 200 or with a possible insulating layer 201 formed on this substrate 200 (FIG. 2H).

Whether or not layer 103 is structured (in other words: whether or not a cavity 109 is present) direct bonding of both substrates 100, 200 can be accomplished. This step can be accomplished at ambient temperature, at atmospheric pressure, notably if the sealing is accomplished without any cavity 109 or in a vacuum.

The process may be completed by a consolidation annealing of the bonding interface (typically at a temperature of 1000° C. to 1200° C. for several hours).

Substrate 200 can then be thinned (FIG. 2I), from its surface opposite the one attached to substrate 100, for example by a polishing technique. It is then sought to obtain a thickness of between 10 μm and 100 μm, notably in the case of an MEMS application.

Figure 2J:
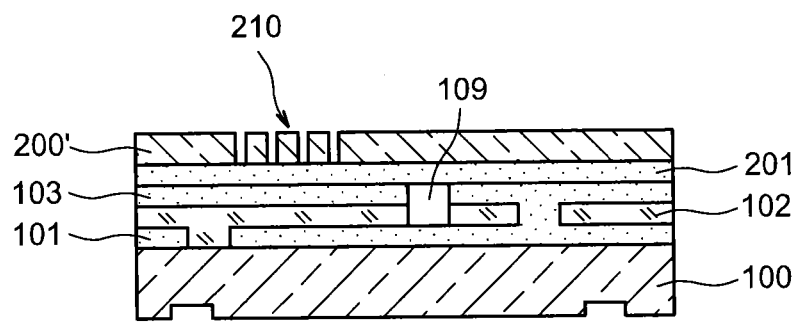
Figure 2K:
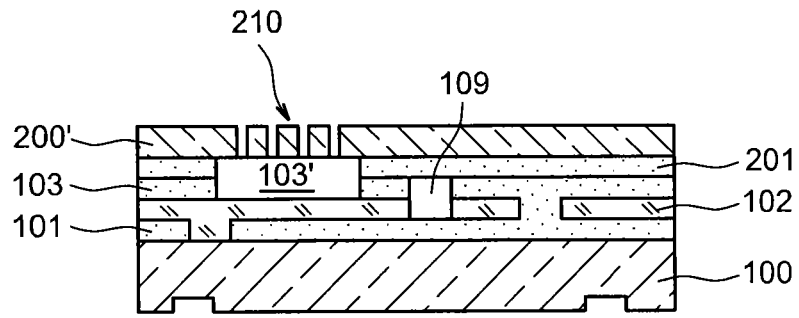

The moving portion of the MEMS is then defined in layer 200' (which results from the thinning of substrate 200) by etching (for example, plasma etching) of layer 200', with stoppage at insulating layer 201, 103, as illustrated in FIG. 2J.

This step enables vertical channels 210 to be produced, which will define the contour of the moving portions of the MEMS.

Lastly, a step of etching of sacrificial layers 201, 103, under layer 200' (FIG. 2K), enables the moving portion which has just been defined to be released. By this means, cavity 103' is formed between moving portion 210 and electrode 102.

It is possible to stop the method at this stage, in which case no assembly with a substrate or cap 300 is accomplished, and therefore there is no $2^{nd}$ electrode. But it is also possible to continue the manufacturing process with the formation of a bead 107 and assembly with a cap, as explained below, in connection with FIGS. 3C-3F (with or without contact 106). If this cap includes an electrode 302, a device with 2 electrodes can then be produced. The cap may be a protective mechanical cap, without any electrode.

A particular example of this method, which enables a direct bonding interface to be obtained, between SiO2 layer 103 and a SiO2 layer 201, of satisfactory quality (i.e. the etching speed of which is not different from that of sacrificial layer), is as follows:
- Deposition of lower electrode layer 102, for example of N or P doped polysilicon of between 100 nm and several microns thick (FIGS. 2A-2D),
- Deposition of a dielectric layer 103, for example TEOS oxide, of the order of several hundred nanometers thick (FIG. 2E),
- Complete densification of this oxide layer 103, for example by oxidisation at a temperature close to the bonding temperature (for example 1050° C.), in order that all the layers have a thermal budget similar to that of the bonding (through the effect of degassing of the layers).
- Polishing of oxide 103 before molecular bonding, enabling a perfectly flat surface to be obtained for the molecular sealing,
- Structuring, or not, of layers 102 and 103,
- Direct bonding at ambient temperature, at atmospheric pressure, if the sealing is accomplished without a cavity or in a vacuum.
- Consolidation annealing of the bonding interface between both substrates 100, 200, typically at a temperature of 1000° C. to 1200° C. for several hours,
- Thinning of substrate 200 until the thickness sought for the moving portion is reached: between 10 μm and 100 μm for an MEMS application, where this thinning of substrate 200 may be accomplished by "grinding" and/or polishing,
- definition of the moving portion in layer 200' by etching of the latter, for example by a plasma technique, with stoppage at insulating layer 201, 103,
- release of the moving portion, by etching of sacrificial layers 201, 103 under the moving portion.

As previously indicated above, alignment marks 99, 99' may have been previously formed, for example by etching, in the rear face of substrate 100.

Indeed, after direct bonding and thinning of substrate 200, new levels can be produced on layer 200', aligning them with the previous levels, obtained before the direct bonding. And these previous levels are no longer visible, by optical reconnaissance, using traditional lithography equipment.

To overcome this difficulty the different levels generated on the front face of substrate 100 are aligned with these marks 99, 99' in the rear face, using an optical reconnaissance system.

Figure 6:
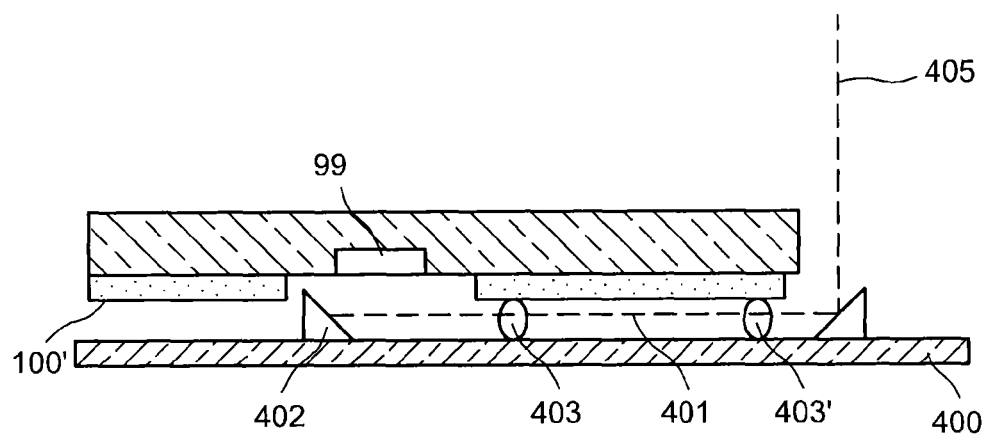
FIG. 6 represents a system enabling substrates to be aligned.

An example of such a device is represented schematically in FIG. 6. Rear face 100' of the substrate, on which marks 99, 99' are made, is positioned on a "chuck" (or plate) 400 on the surface of which means forming an optical guide 401 are provided. These means essentially include optical means such as lenses 403, 403', and mirrors 402, 402'; they will enable a beam 405 to be guided towards lower face 100' of the substrate, in order to read the positions of marks 99. This device enables the precise positions of the marks generated in the rear face to be located, and therefore the other levels, in the front face, to be aligned relative to these marks.

Similarly, after bonding and thinning of substrate 200, all the levels generated in the front face of layer 200' are aligned with these marks 99, 99'.

Any number of substrates may be bonded and thinned, as a substrate 200, and all the levels generated on the front faces of these substrates can be aligned with marks 99, 99' of the rear face of substrate 100, or produced taking account of the positions of these marks, as explained above.

A description now follows, in connection with FIGS. 3A-3F, as to how it is possible to establish a contact between lower 102 and upper 302 capacitive electrodes.

To this end, one commences with a substrate such as the one obtained on conclusion of the step described above in connection with FIG. 2I. This substrate therefore includes at least one lower electrode 102, one sacrificial layer 103 and one structural layer 200'. It may also include one or more zones 101' of contact between electrode 102 and substrate 100.

Lower electrode 102 may include one or more zones 102', 109 where portions of the electrode are insulated from one another.

Figure 3A:
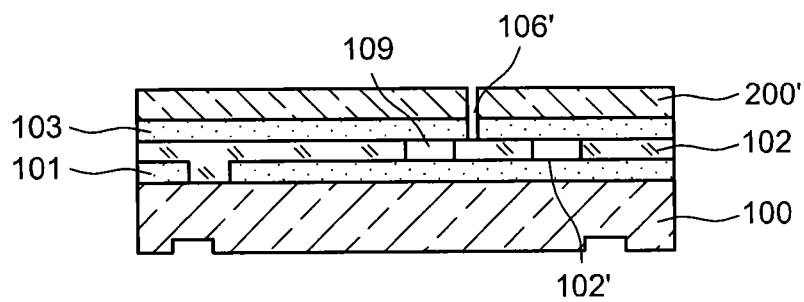
FIGS. 3A-3G represent other steps of production of another device.

The position of one or more vias 106' is defined beforehand. These vias are then etched in structural layer 200' and insulating layer 103, with lower electrode 102 then acting as the boundary layer. This etching is preferentially of the plasma type (FIG. 3A).

Figure 3B:
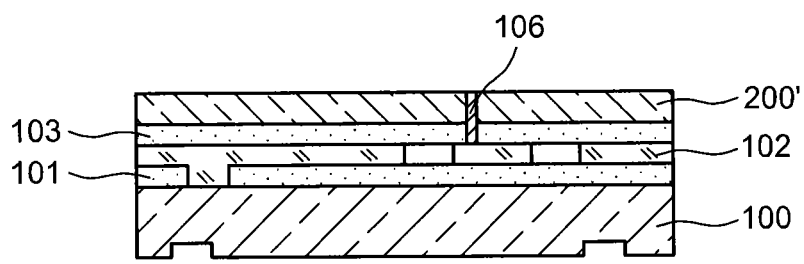
Figure 3C:
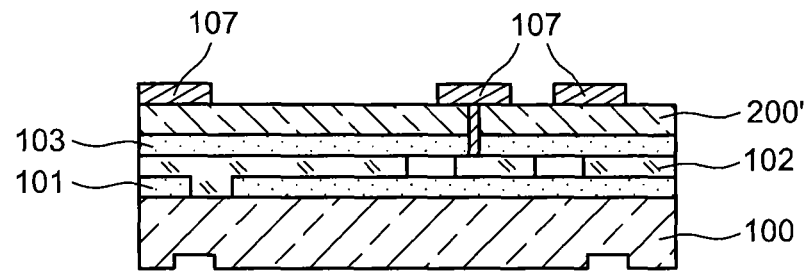
Figure 3D:
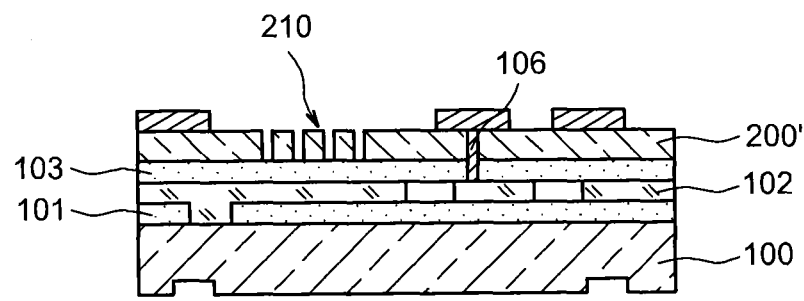
Figure 3E:
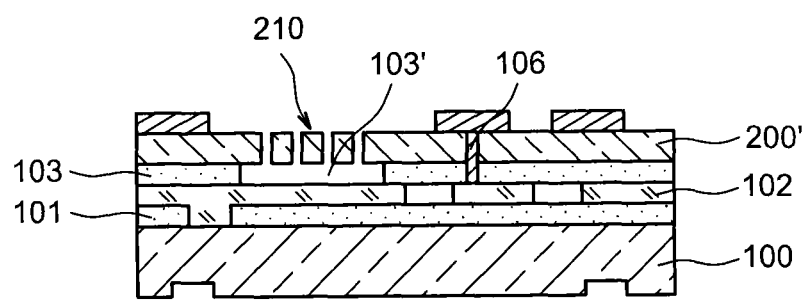

After this, a layer of conducting material 106 is deposited on the surface, this layer being made, for example, of doped polysilicon, metal, or poly-Ge, etc. (FIG. 3B). This material also fills the cavities or via 106'.

This layer can also be either directly structured (and therefore deposited in vias 106', but not on the surface of substrate 200'), or eliminated from the surface of substrate 200' by polishing and/or total etching without any resin mask, in which case the material present in via 106' is the only material which remains.

After this, (FIG. 3C) a new layer of conducting material 107, which can be of a nature different from the material of layer 106, is deposited on layer 200', and then structured, for example by etching. This step enables the locations of the future weld beads to be defined with the cap of the device. At least one of these beads is placed in contact with material 106 used to fill at least one of vias 106'. The thickness of these beads 107 will define the distance between the upper surface of moving portion 210 and upper electrode 302. As a variant, it is possible to have all or a proportion of beads 107 formed beforehand on upper electrode 302, and not on substrate 200'.

The steps of definition of moving structure 210 are then implemented, followed by those of etching of sacrificial layer 103 (FIGS. 3D and 3E), as previously described above.

Figure 3F:
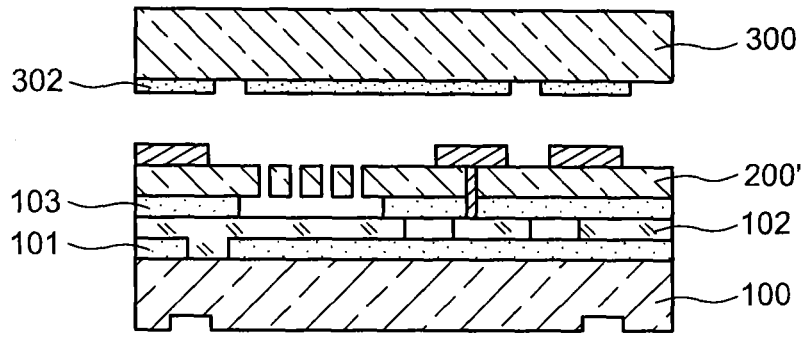

In addition, another substrate 300 has been prepared, called a cap, on a surface of which a layer 302 of conducting material has been deposited and structured. This layer 302 is made of a metal material or of a metal alloy such as, for example, AlCu, AuSn, AlSI or AuGe, etc. (FIG. 3F). Beads 107 may possibly be formed on this conducting layer 302.

Both substrates are then sealed hermetically, for example by eutectic sealing or by thermocompression, in a vacuum or in a controlled atmosphere. Layer 302 can then come into contact with sealing bead 107, so as to be positioned opposite moving portion 210, which is then positioned between two electrodes 102, 302. Or again, if they are located on layer 302, the beads are brought on to layer 200', one of them being positioned in contact with the material for filling via 106'. The structure of FIG. 1 is then obtained.

Layer 302 then also has a hermetic sealing function, enabling a satisfactory level of vacuum to be obtained in the sealed cavity. By means of contacts 106 and bead 107 a contact between upper 302 and lower 102 electrodes is also made. The two substrates 100, 300 are preferably sealed in a vacuum or controlled atmosphere, in order to keep the same level of vacuum in the cavity as in the enclosure in which the sealing is accomplished. The resonant frequency (and therefore the system's response) depends on the level of vacuum in the cavity, and the control of the atmosphere (i.e. of the pressure) in the latter enables this frequency to be set. In order to obtain a determined frequency, a determined pressure is set.

The hermetic sealing also enables moving portion 210 of the device to be protected against the ambient atmosphere.

The device is then ready to detect a movement of moving portion 210, this movement taking place outside the plane of the device, i.e. essentially in direction z.

But the movement of the moving portion may also have a component in a plane parallel to the device's main plane, and therefore perpendicular to Z.

Detection is also accomplished by capacitive electrodes 102, 302. The signal obtained may be transmitted to data processing and data storage means, which are not represented in the figures.

In any of the above embodiments:
the contacts with a view to measuring the voltages detected in the electrodes may be made through substrate 100 and/or through cap substrate 300;
and/or the upper electrode and/or the lower electrode may be etched such that they are not within the sealing zones.

Cap substrate 300 may be, for example, a CMOS substrate. In this case, the last structured metal level (made, for example, of AlCu, or AlSi etc.) of this substrate may be used as an upper electrode 302 and as a hermetic sealing layer.

Figure 3G:
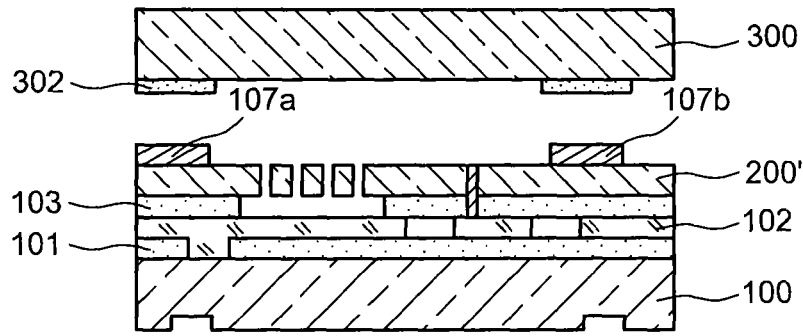

The invention is not restricted to the production of MEMs components with capacitive electrodes; it may apply to any structure including only one buried lower electrode. The above method, with the formation of 2 electrodes 102, 302, can be modified and simplified in order to obtain a device with a single electrode. In this case material 302 need merely not be deposited on substrate 300. If it is desired to make a hermetic seal (for example, for a mechanical protection of the device or a protection against ambient air), material 302 is deposited only above certain sealing beads 107a, 107b, as in FIG. 3G. A device with only one lower electrode may also detect a movement of the moving portion in axis z, but in a less sensitive manner.

In a method or a device as disclosed above, molecular bonding makes it possible to hermetically seal the device, which allows a mobile structure to work in a controlled vacuum or a controlled atmosphere; it is the case in particular for a gyroscope. Molecular bonding involves a high thermal budget or a high temperature (for example between 900° C. and 1200° C.; typically 1100° C. for a SiO2-SiO2 bonding). The materials which are assembled are therefore preferably semi-conductor materials, which are compatible with such a high thermal budget or temperature; in particular the lower electrode is advantageously doped poly-Si.

The invention may be applied to the production of inertial micro-system or nano-system components. This is in particular the case in the motor vehicle field, for the formation of accelerometers in airbags, or of gyroscopes for course correction.

It can also be applied to the production of ultrasound sensors, for medical diagnoses (probe for ultrasound scans). It notably allows the production of devices of the CMUT (Capacitive Micromachined Ultrasonic) type.

It also allows the production of microphones, or again RF switches or pressure sensors, in the motor vehicle, aeronautical or aerospace fields.

The invention claimed is:

1. A device being a micro-system and/or a nano-system, said device comprising:
    a first substrate, including at least one lower electrode, and at least one dielectric layer;
    an intermediate substrate, extending across a main plane of the device, including a moving portion, and attached, outside the moving portion, by molecular bonding to the first substrate, where the moving portion is facing at least a portion of the lower electrode;
    an upper substrate, attached to the intermediate substrate;
    said moving portion being movable between the lower electrode and the upper substrate;
    each of said first substrate, said intermediate substrate, and said upper substrate extending in a plane parallel to the main plane of the device; and
    said lower electrode detecting a component of the movement of said moving portion, said component of the movement being perpendicular to said plane of the device.

2. A device according to claim 1, where the upper substrate includes at least one upper electrode, where the moving portion faces at least a portion of the upper electrode, and where said moving portion is movable between the lower electrode and the upper electrode.

3. A device according to claim 2, further comprising an electrical contact between the lower electrode and the upper electrode.

4. A device according to claim 1, further comprising an electrical contact between the lower electrode and the first substrate.

5. A device according to claim 1, where the upper substrate is fixed securely to the intermediate substrate by a sealing bead.

6. A device according to claim 1, where the intermediate substrate is made from monocrystalline silicon.

7. A device according to claim 1, where the upper substrate is attached to the intermediate substrate hermetically.

8. A device according to claim 1, where the upper substrate is a CMOS device.

9. A device according to claim 1, where the lower substrate includes at least one alignment mark.

10. A device according to claim 1, where the lower substrate includes at least one portion made from a monocrystalline or polycrystalline semiconducting material, or forming an SOI substrate, or composed of several stacked materials.

11. A device according to claim 1, where the lower electrode includes lower electrode zones insulated from one another by at least a portion of dielectric material and/or at least one etched zone.

12. A device according to claim 1, where the movement of the moving portion has a further component in a plane parallel to the main plane.

13. A device according to claim 1, wherein the lower electrode is in a semiconductor material.

* * * * *